(12) United States Patent
Huang et al.

(10) Patent No.: US 9,105,661 B2
(45) Date of Patent: Aug. 11, 2015

(54) FIN FIELD EFFECT TRANSISTOR GATE OXIDE

(75) Inventors: Gin-Chen Huang, New Taipei (TW); Neng-Kuo Chen, Sinshih Township, Tainan County (TW); Hsingjen Wann, Carmel, NY (US)

(73) Assignee: Taiwan Semconductor Manufacturing Company, Ltd., Hsin-Chu (TW)

( * ) Notice: Subject to any disclaimer, the term of this patent is extended or adjusted under 35 U.S.C. 154(b) by 390 days.

(21) Appl. No.: 13/288,407

(22) Filed: Nov. 3, 2011

(65) Prior Publication Data
US 2013/0113026 A1 May 9, 2013

(51) Int. Cl.
*H01L 21/00* (2006.01)
*H01L 29/66* (2006.01)
*H01L 29/78* (2006.01)

(52) U.S. Cl.
CPC ........ *H01L 29/66795* (2013.01); *H01L 29/785* (2013.01)

(58) Field of Classification Search
CPC .......................... H01L 29/66795; H01L 29/785
USPC .......................................... 438/259, 164, 218
See application file for complete search history.

(56) References Cited

U.S. PATENT DOCUMENTS

| 6,642,090 B1 * | 11/2003 | Fried et al. | 438/164 |
| 7,374,996 B2 * | 5/2008 | Kuo et al. | 438/259 |
| 7,960,791 B2 * | 6/2011 | Anderson et al. | 257/349 |
| 2005/0263795 A1 * | 12/2005 | Choi et al. | 257/213 |

OTHER PUBLICATIONS

Unpublished U.S. Appl. No. 13/212,834, filed Aug. 18, 2011 entitled "Semiconductor Device Manufacturing Methods and Methods of Forming Insulating Material Layers", 24 pages.
Wikipedia, "Multipage Device", http://en.wikipedia.org/wiki/FinFET, Aug. 3, 2011, pp. 1-5.

* cited by examiner

*Primary Examiner* — Laura Menz
(74) *Attorney, Agent, or Firm* — Haynes and Boone, LLP (57) ABSTRACT

The present disclosure provides for methods of fabricating a semiconductor device and such a device. A method includes providing a substrate including at least two isolation features, forming a fin substrate above the substrate and between the at least two isolation features, forming a silicon liner over the fin substrate, and oxidizing the silicon liner to form a silicon oxide liner over the fin substrate.

9 Claims, 8 Drawing Sheets

FIN FIELD EFFECT TRANSISTOR GATE OXIDE

BACKGROUND

Variations of metal-oxide-semiconductor field-effect transistor (MOSFET) structures have been explored for improvement in manufacturability and performance. One variation has been known as a "finFET", which includes a strip or "fin" of a material, such as silicon, and a gate formed to surround the fin on three exposed sides. The channel region of the device is located in the fin, and typically a gate dielectric is provided between the fin and the gate.

Conventional gate dielectrics for finFETS have been fabricated using high temperature wet or dry thermal oxidation. However, this method disadvantageously consumes large amounts of silicon, which is a challenge as finFETS have limited substrate space and product dimension shrinks to increasingly smaller nodes.

SUMMARY

The present disclosure provides for many different embodiments. According to one embodiment, a method of fabricating a semiconductor device is provided. The method includes providing a substrate including at least two isolation features, forming a fin substrate above the substrate and between the at least two isolation features, forming a silicon liner over the fin substrate, and oxidizing the silicon liner to form a silicon oxide liner over the fin substrate.

In yet another embodiment, a method for fabricating a semiconductor device includes providing a substrate including a plurality of isolation features, forming a plurality of fin substrates above the substrate, each of the plurality of fin substrates formed between two of the plurality of isolation features, forming a silicon liner over each of the plurality of fin substrates, oxidizing the silicon liner to form a silicon oxide liner over each of the plurality of fin substrates, and forming a gate electrode over the silicon oxide liner.

The present disclosure also provides for a semiconductor device. In one embodiment, the device includes a substrate including at least two isolation features, a fin substrate disposed above the substrate and between the at least two isolation features, a silicon oxide liner disposed over the fin substrate, wherein the silicon oxide liner is formed from thermal oxidation of a silicon liner disposed over the fin substrate, and a gate electrode disposed over the silicon oxide liner.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top", may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper", depending on the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Figure 1:
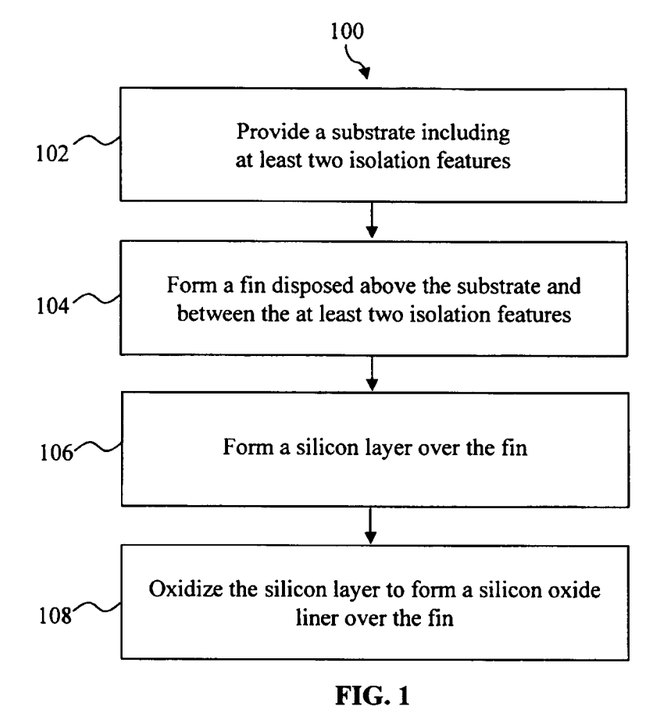
FIG. 1 is a flowchart of a method of fabricating a semiconductor device in accordance with embodiments of the present disclosure.

Referring now to FIG. 1, a flowchart is shown illustrating a method 100 for fabricating a semiconductor device in accordance with an embodiment of the present disclosure. The method 100 includes providing a substrate including at least two isolation features at block 102, forming a fin substrate above the substrate and between the at least two isolation features at block 104, forming a silicon liner over the fin substrate at block 106, and oxidizing the silicon liner to form a silicon oxide liner over the fin substrate at block 108.

The substrate may include various semiconductor devices, and/or other suitable active and/or passive devices. Example semiconductor devices include integrated circuits including a metal-insulator-semiconductor field effect transistor (MOSFET) including complementary MOSFET (CMOS) features, resistors, capacitors, inductors and/or other suitable active and/or passive devices. In an embodiment, the substrate may include an integrated circuit (or portion thereof) designed and formed using a CMOS-based process. A substrate having a device (e.g., integrated circuit) formed by other semiconductor fabrication technologies is also within the scope of the described method.

The isolation features may include shallow trench isolation (STI) features filled with an oxide or dielectric, but other isolation features may be used and are within the scope of the present disclosure.

According to one aspect, the fin substrate may be formed between the at least two isolation features, and at a vertical level at least partially above the at least two isolation features.

In one example, the substrate and the fin substrate may each be comprised of silicon (Si), germanium (Ge), or a combination of Si and Ge. In other embodiments, the substrate and the fin substrate may each be comprised of other materials, such as Group III-V compounds or combinations thereof (e.g., InGaAs, InAs, GaSb, or InGaSb as channel material and AlAsSb as a buffer). The material of the substrate and the fin substrate may each be chosen such that a resulting stress is beneficial for either holes or electrons depending on the type of device being fabricated (e.g., either PMOS or NMOS devices).

In one example, the silicon liner may be formed by depositing amorphous silicon over the fin substrate, and according to one aspect, the amorphous silicon may be deposited to a thickness between about 5 angstroms and about 50 angstroms at a temperature between about 400 degrees Celsius and about 600 degrees Celsius. The amorphous silicon layer may be deposited over a top surface and sidewalls of the fin substrate and over exposed top surfaces of the substrate and/or isolation features.

In another example, the silicon liner may be formed by selectively forming an epitaxial layer of silicon over the fin substrate, and according to one aspect, the epitaxial layer of silicon may be grown to a thickness between about 5 angstroms and about 50 angstroms at a temperature between about 600 degrees Celsius and about 800 degrees Celsius. The epitaxial layer of silicon may be deposited over a top surface and sidewalls of the fin substrate.

In yet another example, the silicon liner may be oxidized by thermal oxidation at a temperature between about 700 degrees Celsius and about 1,100 degrees Celsius.

The various structures in the method 100 described above may be formed by various deposition, pattern, and/or etch techniques. It should be noted that the operations of the method 100 may be rearranged or otherwise modified within the scope of the various aspects. It is further noted that additional processes may be provided before, during, and after the method 100, and that some other processes may only be briefly described herein. Thus, other implementations are possible with the scope of the various aspects described herein.

According to one aspect, the method 100 may further comprise forming a fin substrate buffer region in the substrate below the fin substrate and between the at least two isolation features.

According to another aspect, method 100 may further comprise forming a gate electrode over the silicon oxide liner.

According to yet another aspect of the present disclosure, a method of fabricating a semiconductor device may include providing a substrate including a plurality of isolation features, forming a plurality of fin substrates above the substrate, each of the plurality of fin substrates formed between two of the plurality of isolation features, forming a silicon liner over each of the plurality of fin substrates, oxidizing the silicon liner to form a silicon oxide liner over each of the plurality of fin substrates, and forming a gate electrode over the silicon oxide liner.

Figure 2A:
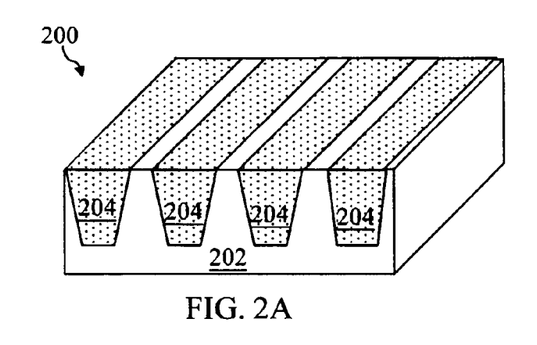
FIGS. 2A-2F are perspective views of a semiconductor device at various stages of fabrication in accordance with embodiments of the present disclosure.

Referring now to FIGS. 2A-2F, perspective views of a semiconductor device 200 at various stages of fabrication are illustrated in accordance with an embodiment of the present disclosure. FIG. 2A illustrates a semiconductor device 200 having a substrate 202 including a plurality of (and at least two) isolation features 204.

In one embodiment, substrate 202 may include a semiconductor substrate, and may be comprised of silicon, or alternatively may include silicon germanium, gallium arsenide, or other suitable semiconductor materials. The substrate may further include doped active regions and other features such as a buried layer, and/or an epitaxy layer. Furthermore, the substrate may be a semiconductor on insulator such as silicon on insulator (SOI). In other embodiments, the semiconductor substrate may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate may include underlying layers, devices, junctions, and other features (not shown) formed during prior process steps or which may be formed during subsequent process steps.

In one embodiment, substrate 202 is comprised of silicon (Si), germanium (Ge), or a combination of Si and Ge, depending upon whether PMOS or NMOS devices are being fabricated. In one example, substrate 202 is comprised of silicon and a substrate buffer region 203 is doped with p-type dopants to fabricate a PMOS device. In another example, substrate 202 is comprised of germanium or a combination of silicon and germanium and substrate buffer region 203 is doped with n-type dopants to fabricate an NMOS device.

The isolation features 204 may include shallow trench isolation (STI) features filled with an oxide or dielectric, but other isolation features may be used and are within the scope of the present disclosure. The oxide or dielectric of isolation features 204 may be formed by various processes, such as thermal oxidation and/or plasma enhanced chemical vapor deposition (PECVD). In one example, an anisotropic etch of the isolation features 204, such as an anisotropic etch of a field oxide of shallow trench isolation features may be performed. Various etch techniques, such as dry and/or wet etch techniques may be used to etch the isolation features 204. In one example, an oxide etcher with a fluorinated etchant gas may be used in conjunction with a patterned photoresist. In another example, an anisotropic RIE procedure (e.g., using $Cl_2$ or $SF_6$ as an etchant) may be used.

In one embodiment, semiconductor substrate 202 may be comprised of single crystalline, P type silicon, featuring a <100> crystallographic orientation. Other crystallographic orientations are within the scope of the present disclosure. A silicon nitride layer, for example having a thickness between about 1000 to 2000 Angstroms, may formed on the top surface of semiconductor substrate 202, via low pressure chemical vapor deposition (LPCVD), or plasma enhanced chemical vapor deposition (PECVD) procedures, for example. Conventional photolithographic and reactive ion etching (RIE) procedures may be used to define shallow trench shapes, through the silicon nitride layer, and to a depth between about 3000 to 6000 Angstroms in semiconductor substrate 202. The RIE procedure may be performed using $Cl_2$ as an etchant for both the silicon nitride layer and the semiconductor substrate. After removal of the photoresist shape used to define shallow trench shapes, via plasma oxygen ashing procedures, for example, a silicon oxide layer may be deposited via LPCVD or PECVD procedures at a thickness between about 4000 to 10000 Angstroms, using tetraethylorthosilicate (TEOS) as a source, to completely fill the shallow trench shapes. A chemical mechanical polishing (CMP) procedure may then be employed to remove portions of the silicon oxide layer from the top surface, resulting in silicon oxide filled, STI regions, or isolation features 204.

Figure 2B:
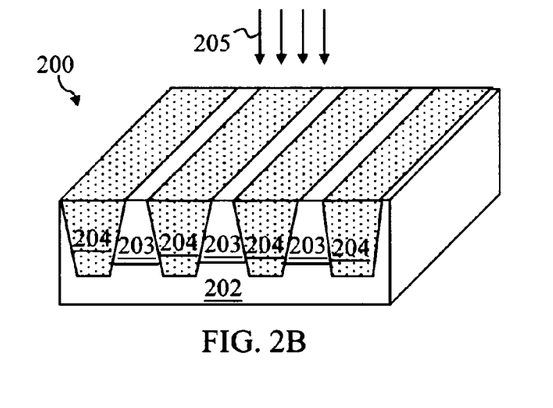

FIG. 2B illustrates the formation of substrate buffer or fin substrate buffer regions 203 between isolation features 204, such as by an ion implantation or doping process 205. The formation of substrate buffer regions may be accomplished utilizing a photoresist shape (not shown in the drawings), to block a portion of the semiconductor substrate from an ion implantation procedure performed using p-type dopants or n-type dopants, as desired to fabricate PMOS and/or NMOS regions. P-type dopants, such as boron ions, may be applied at an energy between about 20 to 400 KeV, and at a dose between about 1e12 and about 1e14 atoms/$cm^2$. In other cases, or in additional fabrication areas, n-type implantation, such as arsenic or phosphorous ions, may be performed at an energy between about 20 to about 500 KeV, at a dose between about 1e12 to about 1e14 atoms/$cm^2$. If not previously performed, threshold adjust and anti-punch through implants may also be performed. Additional ion implantation procedures can be used. Removal of the photoresist block out shapes may be accomplished via plasma oxygen ashing procedures.

In yet another example, substrate buffer region 203 may be doped with p-type dopants at levels ranging between about 1e17 $cm^{-3}$ and about 1e-19 $cm^{-3}$, and in one example is a silicon buffer region doped at 1e18 $cm^{-3}$.

In yet another example, a substrate buffer region may be formed by removing a portion of the silicon substrate and epitaxially regrowing an in-situ doped layer.

Figure 2C:
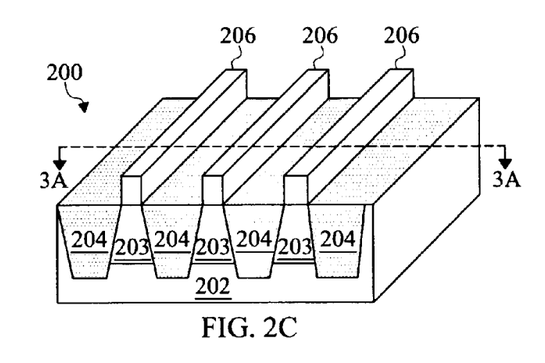

FIG. 2C illustrates a plurality of fin substrates 206 (also referred to simply as a fin or fins) disposed above the substrate 202 and between at least two isolation features 204. In one example, fin substrates 206 are further disposed above substrate buffer regions 203 and at a vertical level above the at least two isolation features 204. In one aspect, fin substrates 206 are formed at a vertical level substantially completely above the at least two isolation features. In another aspect, fin substrate 206 may be formed to have a portion at a vertical level above the at least two isolation features and a portion below the top surface of the substrate 202. In another example, the fin substrate 206 is formed as a strained SiGe channel layer comprised of between about 25% Ge and about 50% Ge, having a length between about 100 nm and about 200 nm, a width between about 10 nm and about 20 nm, and a thickness between about 10 nm and about 40 nm. In yet another example, the fin substrate 206 is a strained SiGe channel layer comprised of about 50% Ge, having a length of about 100 nm, a width of about 10 nm, and a height above the at least two isolation features of about 10 nm.

In one aspect of the present disclosure, fin substrates 206 may be formed by a SiGe or Ge condensation technique or epitaxially grown. For example, fin substrates 206 may be formed by selective epitaxial growth in any suitable epitaxial deposition system and process, such as metal-organic chemical vapor deposition (MOCVD), atmospheric pressure CVD (APCVD), low-(or reduced-) pressure CVD (LPCVD), ultra-high vacuum CVD (UHCVD), molecular beam epitaxy (MBE), or atomic layer deposition (ALD). In a CVD process, selective epitaxial growth typically includes introducing a source gas into a chamber. The source gas may include at least one precursor gas and a carrier gas. The reactor chamber may be heated by, for example, RF-heating, and the growth temperature in the chamber may range from about 300 degrees Celsius to about 900 degrees Celsius, depending on the composition of the crystalline material of the fin substrate to be formed. The epitaxial growth system may be a single-wafer or multiple-wafer batch or inline reactor.

In yet another embodiment, after a pre-clean procedure performed using a dilute or buffered hydrofluoric acid solution, for example, the fin substrate 206 may be selectively grown on exposed semiconductor surfaces above substrate buffer regions 203. Various deposition processes may be used. In one example, an ultra-high vacuum chemical vapor deposition (UHV-CVD) procedure may be employed. The addition of chlorine gas or HCl gas may enhance the selectivity of the epitaxial growth. The growth of the fin substrate 206 may be selectively deposited using silane ($SiH_4$) or disilane ($Si_2H_6$), and germane ($GeH_4$) or digermane as reactants. In one example, a strained SiGe layer may be achieved using a germanium weight percent between about 25% to about 50%. The thickness may be chosen to be sufficient enough to contain the inversion charge, however not thick enough to allow defect to lead to unwanted device leakage.

In yet another embodiment, the fin substrate 206 may be formed by growing a non-selective layer and subsequently using a patterning procedure to remove portions of the non-selective channel layers from non-active device regions, such as from the top surface of isolation features 204.

Figure 2D:
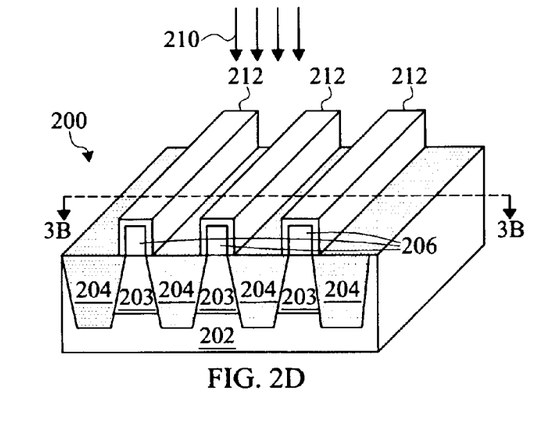

FIG. 2D illustrates the deposition of a silicon liner 212 (also referred to simply as a silicon layer) over the fin substrates 206 by a process 210 (e.g., an epitaxial growth process). Silicon liner 212 may be formed by various applicable techniques and processes. In this embodiment, the silicon liner 212 is formed by selectively forming an epitaxial layer of silicon over each of the plurality of fin substrates 206. In one example, the epitaxial layers of silicon may be grown to a thickness between about 5 angstroms and about 50 angstroms at a temperature between about 600 degrees Celsius and about 800 degrees Celsius.

In one example, the silicon liner 212 or epitaxial layer is formed over top and sidewall surfaces of each of the fin substrates 206, and in another example, substantially covers all exposed portions of the fin substrates 206. In one example, the epitaxial layer may be comprised of silicon and may be selectively deposited by epitaxial growth using silane ($SiH_4$) or disilane ($Si_2H_6$).

In yet another example, the silicon liner 212 may be formed by selective epitaxial growth in any suitable epitaxial deposition system and process, such as metal-organic chemical vapor deposition (MOCVD), atmospheric pressure CVD (APCVD), low- (or reduced-) pressure CVD (LPCVD), ultra-high vacuum CVD (UHCVD), molecular beam epitaxy (MBE), or atomic layer deposition (ALD). In a CVD process, selective epitaxial growth typically includes introducing a source gas into a chamber. The source gas may include at least one precursor gas and a carrier gas. The reactor chamber may be heated by, for example, RF-heating, and the growth temperature in the chamber may range from about 300 degrees Celsius to about 900 degrees Celsius, depending on the composition of the crystalline material of the epitaxial layer to be formed. The epitaxial growth system may be a single-wafer or multiple-wafer batch or inline reactor.

Figure 2E:
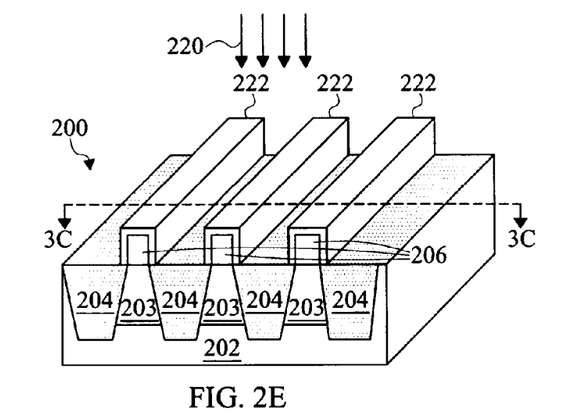

FIG. 2E illustrates the oxidation of silicon liner 212 by a process 220 (e.g., thermal oxidation) to form silicon oxide liners 222 (also referred to simply as silicon oxide layer) over each of the fin substrates 206. Silicon liner 212 may be oxidized by various applicable techniques and processes. In one example, the silicon liner 212 may be oxidized by thermal oxidation at a temperature between about 700 degrees Celsius and about 1,100 degrees Celsius to form silicon oxide liners 222 over a top surface and sidewalls of each of the fin substrates 206.

Figure 2F:
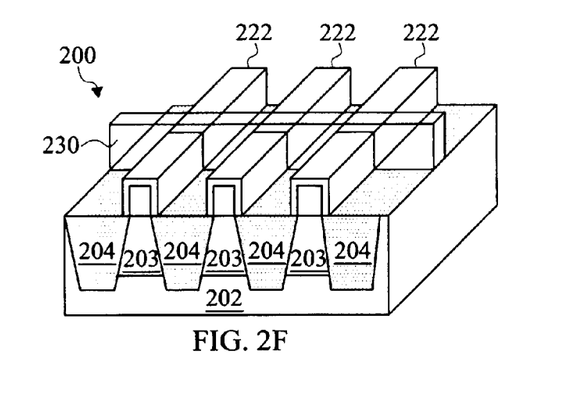

FIG. 2F illustrates the formation of a gate 230 over silicon oxide liners 222, the gate 230 being formed in a perpendicular direction to the channel layers or fin substrates 206, although gate 230 is not limited to this particular direction. Thus, in one example, gate 230 is formed over a top surface and sidewalls of each of the silicon oxide liners 222. In one example, gate 230 may be formed by deposition and selective removal of a conductive gate material, including but not limited to polysilicon, amorphous Si, Ge or SiGe gate material, and/or a metal or metal alloy. In one example, an undoped polysilicon layer may be deposited (e.g., via LPCVD procedures), and conventional photolithographic and anisotropic RIE procedures (e.g., using $Cl_2$ or $SF_6$ as an etchant) may be used to define a polysilicon gate structure 230. The photoresist shape, (not shown in the drawings), used as a defining mask for the polysilicon gate structures, may be removed via plasma oxygen ashing procedures and careful wet cleans.

Figure 3A:
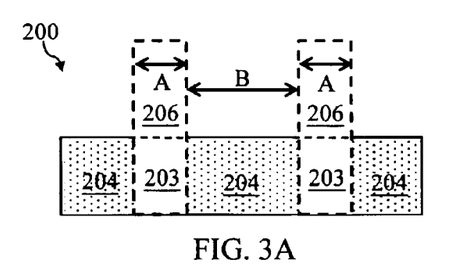
FIGS. 3A-3C are cross-sectional views of the semiconductor device of FIGS. 2C, 2D, and 2E along lines 3A-3A, 3B-3B, and 3C-3C, respectively, in accordance with embodiments of the present disclosure.
Figure 3B:
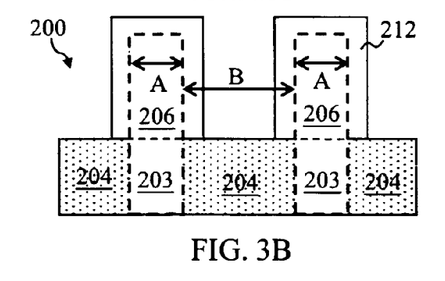
Figure 3C:
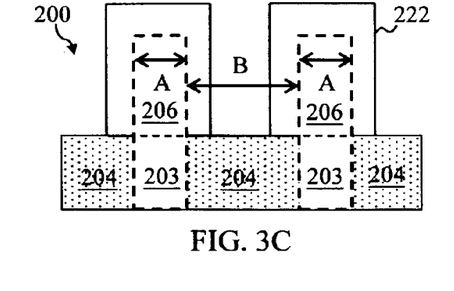

Referring now to FIGS. 3A-3C, cross-sectional views are illustrated of semiconductor device 200 of FIGS. 2C, 2D, and 2E along lines 3A-3A, 3B-3B, and 3C-3C, respectively, in accordance with embodiments of the present disclosure. In one embodiment, the width of each of the fin substrates 206 is about A, and a space between adjacent fin substrates 206 is about B. In one example, A is between about 10 nanometers and about 20 nanometers, and in another example, is less than about 15 nanometers. In one example, B is between about 10 nanometers and about 100 nanometers, and in another example, is less than about 35 nanometers.

Figure 4A:
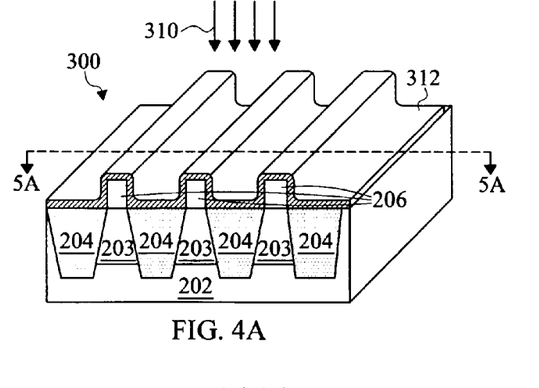
FIGS. 4A-4C are perspective views of another semiconductor device at various stages of fabrication in accordance with embodiments of the present disclosure.
Figure 4B:
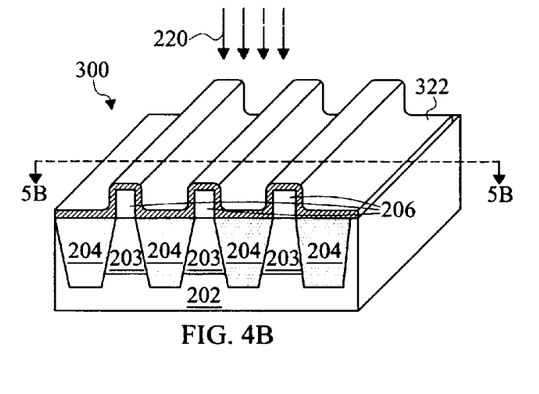
Figure 4C:
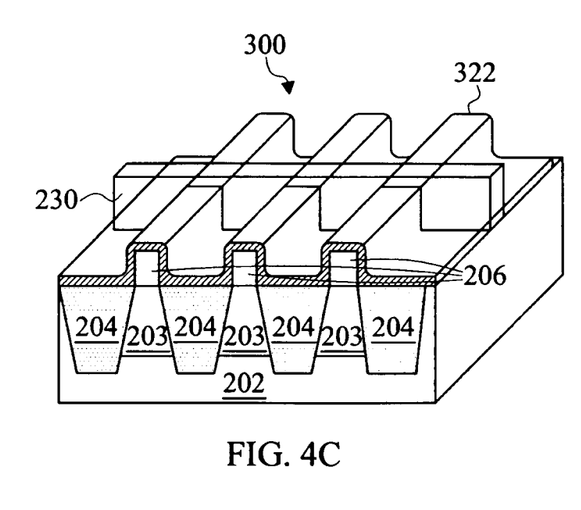

Referring now to FIGS. 4A-4C, perspective views are illustrated of another semiconductor device 300 at various stages of fabrication in accordance with embodiments of the present disclosure. A deposition process 310 of FIG. 4A takes place upon device 200 of FIG. 2C. Similarly numbered features in device 200 (such as the substrate 202, buffer regions 203, isolation features 204, and fin substrate 206) are fully applicable in this embodiment with respect to device 300 although descriptions may not be repeated here to avoid repetitive descriptions.

FIG. 4A illustrates the deposition of a silicon liner 312 over the fin substrates 206 by a deposition process 310. Silicon liner 312 may be formed by various applicable techniques and processes. In this embodiment, the silicon liner 312 is formed by deposition of amorphous silicon over each of the plurality of fin substrates 206 and exposed top surfaces of substrate 202 and/or isolation features 204. In one example, the amorphous layer of silicon may be grown to a thickness between about 5 angstroms and about 50 angstroms at a temperature between about 400 degrees Celsius and about 600 degrees Celsius.

In one example, the silicon liner 312 or amorphous layer is formed over top and sidewall surfaces of each of the fin substrates 206, and in another example, substantially covers all exposed portions of the substrate 202 including the isolation features 204. In one example, the amorphous layer may be comprised of silicon and may be deposited by using silane ($SiH_4$) or disilane ($Si_2H_6$), or in any suitable deposition system and process, such as chemical vapor deposition (CVD) or plasma enhanced CVD (PECVD).

FIG. 4B illustrates the oxidation of silicon liner 312 by a process 220 (e.g., thermal oxidation) to form silicon oxide liner layer 322 over each of the fin substrates 206 and isolation features 204. Silicon liner 312 may be oxidized by various applicable techniques and processes. In one example, the silicon liner 312 may be oxidized by thermal oxidation at a temperature between about 700 degrees Celsius and about 1,100 degrees Celsius to form silicon oxide liner layer 322 over a top surface and sidewalls of each of the fin substrates 206.

FIG. 4C then illustrates the formation of a gate 230 over silicon oxide liner layer 322, the gate 230 being formed in a perpendicular direction to the channel layers or fin substrates 206, although gate 230 is not limited to this particular direction. Thus, in one example, gate 230 is formed over a top surface and sidewalls of the silicon oxide liner layer 322. In one example, gate 230 may be formed by deposition and selective removal of a conductive gate material, including but not limited to polysilicon, amorphous Si, Ge or SiGe gate material, and/or a metal or metal alloy. In one example, an undoped polysilicon layer may be deposited (e.g., via LPCVD procedures), and conventional photolithographic and anisotropic RIE procedures (e.g., using $Cl_2$ or $SF_6$ as an etchant) may be used to define a polysilicon gate structure 230. The photoresist shape, (not shown in the drawings), used as a defining mask for the polysilicon gate structures, may be removed via plasma oxygen ashing procedures and careful wet cleans.

Figure 5A:
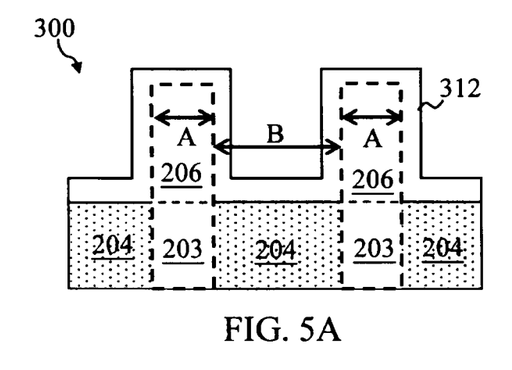
FIGS. 5A and 5B are cross-sectional views of the semiconductor device of FIGS. 4A and 4B along lines 5A-5A and 5B-5B, respectively, in accordance with embodiments of the present disclosure.
Figure 5B:
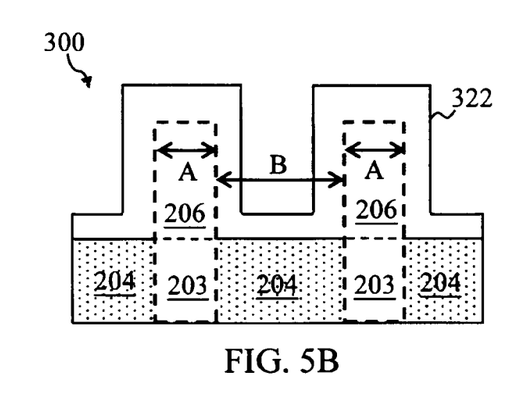

Referring now to FIGS. 5A and 5B, cross-sectional views are illustrated of semiconductor device 300 of FIGS. 4A and 4B along lines 5A-5A and 5B-5B, respectively, in accordance with embodiments of the present disclosure. In one embodiment, the width of each of the fin substrates 206 is about A, and a space between adjacent fin substrates 206 is about B. In one example, A is between about 10 nanometers and about 20 nanometers, and in another example, is less than about 15 nanometers. In one example, B is between about 10 nanometers and about 100 nanometers, and in another example, is less than about 35 nanometers.

Accordingly, FIGS. 2F and 4C each illustrate a semiconductor device comprised of a substrate 202 including at least two isolation features 204, a fin substrate 206 disposed above the substrate 202 and between the at least two isolation features 204, and a silicon oxide liner 222 or 322 disposed over the fin substrate 206, respectively, wherein the silicon oxide liner 222 or 322 is formed from thermal oxidation of a silicon liner 212 or 312 previously disposed over the fin substrate 206, respectively. A gate electrode 230 is disposed over the silicon oxide liner 222 or 322.

Advantageously, the transistor devices and fabrication methods described above may be easily integrated with standard CMOS processes. Furthermore, the present disclosure allows for the formation of an epitaxial silicon liner or an amorphous silicon liner over a fin substrate to increase fin width and subsequently allow for thermal oxidation of the silicon liner to provide a high quality gate dielectric (e.g., as compared to LPCVD HTO oxide). Thus, the fin substrate width and uniformity may be advantageously controlled for improved device performance, yield, and fabrication.

Thus, the present disclosure provides for various advantageous embodiments. In one embodiment, a method of fabricating a semiconductor device is provided. The method includes providing a substrate including at least two isolation features, forming a fin substrate above the substrate and between the at least two isolation features, forming a silicon liner over the fin substrate, and oxidizing the silicon liner to form a silicon oxide liner over the fin substrate.

In yet another embodiment, a method for fabricating a semiconductor device includes providing a substrate including a plurality of isolation features, forming a plurality of fin substrates above the substrate, each of the plurality of fin substrates formed between two of the plurality of isolation features, forming a silicon liner over each of the plurality of fin substrates, oxidizing the silicon liner to form a silicon oxide liner over each of the plurality of fin substrates, and forming a gate electrode over the silicon oxide liner.

The present disclosure also provides for a semiconductor device. In one embodiment, the device includes a substrate including at least two isolation features, a fin substrate disposed above the substrate and between the at least two isolation features, a silicon oxide liner disposed over the fin substrate, wherein the silicon oxide liner is formed from thermal oxidation of a silicon liner disposed over the fin substrate, and a gate electrode disposed over the silicon oxide liner.

Although embodiments of the present disclosure have been described in detail, those skilled in the art should understand that they may make various changes, substitutions and alterations herein without departing from the spirit and scope of the present disclosure. For example, other materials for the substrate, fin substrate, and epitaxial layers, such as Group III-V materials, are also within the scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of fabricating a semiconductor device, the method comprising:
   providing a substrate including at least two isolation features;
   forming a fin extending above the substrate and between the at least two isolation features, wherein the fin has a top surface two opposing sidewalls, and a first width;
   depositing an amorphous silicon layer over the fin including on the top surface and the two opposing sidewalls;
   oxidizing the amorphous silicon layer to concurrently form a silicon oxide layer directly on the top surface and the sidewall surfaces of the fin, wherein the fin has the first width after the oxidizing the amorphous silicon layer; and
   forming a gate electrode on the concurrently formed silicon oxide layer that is disposed on the top and sidewall surfaces of the fin, wherein the fin having the first width forms a channel of the semiconductor device having a gate structure on the fin including the gate electrode and a gate dielectric layer of the formed silicon oxide layer.

2. The method of claim 1, wherein the amorphous silicon is deposited to a thickness between about 5 angstroms and about 50 angstroms at a temperature between about 400 degrees Celsius and about 600 degrees Celsius.

3. The method of claim 1, wherein forming the amorphous silicon layer includes forming a layer of amorphous silicon to a thickness between about 5 angstroms and about 50 angstroms.

4. The method of claim 1, wherein oxidizing the silicon layer includes oxidizing the silicon layer by thermal oxidation at a temperature between about 700 degrees Celsius and about 1,100 degrees Celsius.

5. The method of claim 1, further comprising forming a fin buffer region in the substrate below the fin substrate and coplanar with the at least two isolation features.

6. A method of fabricating a semiconductor device, the method comprising:
   providing a substrate including first and second isolation features;
   forming a first fin above the substrate, the first fin being formed between the first and second isolation features such that the first fin has a first linear sidewall and an opposing second linear sidewall, the first sidewall having a direct interface with the first isolation feature and the second linear sidewall having a direct interface with the second isolation feature;

forming an amorphous silicon layer over the first fin directly on the first and second linear sidewalls;

oxidizing the amorphous silicon layer to form a silicon oxide layer having a direct interface with the first and second linear sidewalls of the first fin;

retaining the silicon oxide layer;

forming a gate electrode on the retained silicon oxide layer; and providing a channel of the semiconductor device in the first fin underlying the gate electrode and the retained silicon oxide layer, the channel extending from the first linear sidewall to the second linear sidewall.

7. The method of claim 6, wherein the substrate includes a third isolation feature, the method further comprising:

forming a second fin extending above the substrate, the second fin being formed between the second and third isolation features;

forming the amorphous silicon layer over the second fin; and oxidizing the amorphous silicon layer to form a silicon oxide layer over the second fin.

8. The method of claim 7 further comprising:

forming a gate electrode over the silicon oxide layer.

9. The method of claim 7, wherein forming the amorphous silicon layer includes selectively forming an layer of amorphous silicon over each of the first and second of fins.

\* \* \* \* \*